United States Patent [19]

Tanaka et al.

[11] Patent Number: 5,164,246
[45] Date of Patent: * Nov. 17, 1992

[54] HIGHLY THERMOCONDUCTIVE CERAMIC

[75] Inventors: Shunichiro Tanaka; Akio Sayano; Yasuyuki Sugiura, all of Yokohama; Hiroyuki Ishizuka, Fujisawa, all of Japan

[73] Assignee: Kabushiki Kaisha Toshiba, Kanagawa, Japan

[*] Notice: The portion of the term of this patent subsequent to Sep. 13, 2005 has been disclaimed.

[21] Appl. No.: 289,432

[22] Filed: Dec. 22, 1988

Related U.S. Application Data

[63] Continuation of Ser. No. 905,966, Sep. 11, 1986, abandoned.

[30] Foreign Application Priority Data

Sep. 13, 1985 [JP] Japan .................. 60-203104

[51] Int. Cl.$^5$ .................. B32B 9/00; C04B 35/58
[52] U.S. Cl. .................. 428/209; 427/123; 427/126.1; 427/126.2; 428/210; 428/698; 428/699; 428/901; 501/96; 501/152; 501/153
[58] Field of Search .................. 228/121, 122, 123, 124; 427/96, 126.1, 126.2, 688, 689; 428/195, 198, 209, 457, 469, 470, 472, 615, 621, 627, 698, 699, 704, 901; 501/96, 127, 153, 152

[56] References Cited

U.S. PATENT DOCUMENTS

| | | | |
|---|---|---|---|
| 3,197,290 | 7/1965 | Williams . | |
| 4,611,745 | 9/1986 | Nakahashi et al. | 228/123 |
| 4,614,689 | 9/1986 | Ikeda et al. | 427/126.2 |
| 4,626,451 | 12/1986 | Tanaka et al. | 427/126.2 |
| 4,770,953 | 9/1988 | Horiguchi | 428/698 |
| 4,800,137 | 1/1989 | Okuno et al. | 428/698 |
| 4,820,562 | 4/1989 | Tanaka et al. | 428/34.6 |

FOREIGN PATENT DOCUMENTS

| | | | |
|---|---|---|---|
| 0122522 | 10/1984 | European Pat. Off. . | |
| 2528255 | 2/1976 | Fed. Rep. of Germany | 428/698 |
| 0116285 | 10/1978 | Japan | 428/698 |
| 0160984 | 10/1982 | Japan . | |
| 0076000 | 11/1984 | Japan . | |
| 0077185 | 5/1985 | Japan . | |
| 0200871 | 10/1985 | Japan | 228/122 |
| 0040871 | 2/1986 | Japan . | |
| 0077681 | 4/1986 | Japan . | |

OTHER PUBLICATIONS

IEEE, 1985, pp. 26-31; "High Performance Aluminum Nitride Substrate by Tape Casting Technology"; Werdecker et al.

Primary Examiner—George F. Lesmes
Assistant Examiner—Christopher Brown
Attorney, Agent, or Firm—Finnegan, Henderson Farabow, Garrett and Dunner

[57] ABSTRACT

A highly thermoconductive ceramic substrate, which is characterized by having formed on a ceramic substrate an electroconductive coating of a mixture of tungsten and/or molybdenum with the nitride of a transition metal belonging to Group IVa of the Periodic Table of Elements. As the ceramic substrate in the present invention, a non-oxide type ceramic substrate is used because of satisfactory strength. The formation of the electroconductive coating consisted preponderantly of a mixture of tungsten and/or molybdenum with the nitride of a metal belonging to Group IVa of the Periodic Table Elements is accomplished, for example, by preparing a metallizing composition in the form of a paste or solution containing a metal salt of tungstic acid or molybdic acid and a transition metal of Group IVa or a compound thereof, applying the metallizing composition on the ceramic substrate, heating the resulting composite, then firing the composite.

5 Claims, 2 Drawing Sheets

HIGHLY THERMOCONDUCTIVE CERAMIC

This application is a continuation, of application Ser. No. 905,966, filed Sept. 11, 1986, now abandoned.

The present application claims priority of Japanese Patent Application No.60-203104 filed on Sept. 13, 1985.

FIELD OF THE INVENTION AND RELATED ART STATEMENT

This invention relates to a highly thermoconductive ceramic substrate suitable as a substrate for a semiconductor.

Heretofore, as ceramic substrates for semiconductors, those made of alumina have been used prevalently. The recent trend toward increased capacity for electric power, increased integration of circuits, and increased modulation of components has been urging development of ceramic substrates of higher efficiency of heat radiation, i.e. high thermoconductivity. As ceramic substrates of high thermoconductivity, those made of beryllia have been used for a long period of time. These ceramic substrates of beryllia, however, find only limited applications on account of toxicity. They also have a drawback of high cost.

In recent years, efforts for development have been continued on ceramic substrates made of aluminum nitride because these ceramic substrates enjoy high thermoconductivity and outstanding electric properties such as high electric resistivity, high insulating voltage, low dielectric constant, and low dielectric loss and, what is more, permit atmospheric sintering and stratification of substrate. The ceramic substrates of aluminum nitride, however, do not permit ready superposition of an electroconductive coating thereon and do not enable a conductive circuit to be formed thereon or a semiconductor chip to be mounted thereon by wire bonding. Thus, these ceramic substrates still have items for further improvement in the properties mentioned above.

The conventional thick film paste method which consists in the act of applying and firing a paste made of metal powder and glass powder has the advantage of the ability to permit extremely fine wiring and yet suffers from the disadvantage that the paste offers only a small adhesive strength of 1 to 2 kg/mm$^2$ between an electroconductive coating and a substrate and exhibits poor thermal stability. The molybdenum-manganese metallizing method offers weak adherence in the case of a niride type ceramic substrate, though it enables an electroconductive coating of high strength to be formed on an alumina type ceramic substrate.

The so-called DBC method (direct bonding copper method) which consists in directly bonding a copper plate to ceramic substrate, despite the advantage that the number of operational steps is small and the adhesive strength is large, has the disadvantage that the formation of fine patterns has its limit, the temperature and the atmosphere during the course of bonding are controlled only with difficulty, and the adhesive strength is liable to be dispersed.

Further, since aluminum nitride is not readily wetted by any metal, all these conventional methods require to subject the aluminum nitride to an oxidizing treatment and form an alumina coating on the surface thereof and consequently induce dispersion of the strength of adherence and increase the number of operational steps.

OBJECT AND SUMMARY OF THE INVENTION

This invention has been produced for the purpose of overcoming these drawbacks. It aims to provide a highly thermoconductive ceramic substrate which excels in thermal stability, exhibits high strength of adherence, and permits formation of very fine electroconductive circuits.

To be more specific, this invention is directed to a highly thermoconductive ceramic substrate, which is characterized by having formed on a ceramic substrate an electroconductive coating consisted of a mixture of tungsten and/or molybdenum with the nitride of a transition metal belonging to Group IVa of the IUPAC Periodic Table of Elements.

As the ceramic substrate in the present invention, a non-oxide type ceramic substrate is used because of satisfactory strength. Particularly, an aluminum nitride type ceramic substrate proves suitable because of its high thermoconductivity.

The formation of the electroconductive coating consisted preponderantly of a mixture of tungsten and/or molybdenum with the nitride of a metal belonging to Group IVa of the IUPAC Periodic Table of Elements is accomplished, for example, by preparing a metallizing composition in the form of paste or solution containing a metal salt of tungstic acid or molybdic acid and a transition metal of Group IVa or a compound thereof, applying the metallizing composition on the ceramic substrate or infiltrating the ceramic substrate with the metallizing composition, heating the resulting composite to a temperature exceeding the temperature at which the metal salt of tungstic acid or molybdic acid melt, and then firing the composite in a non-oxidizing atmosphere at a temperature exceeding 1,100° C. The formation of the metallizing composition layer is carried out, for example, by the screen printing method practically in a thickness approximately in the range of 5 to 20 μm.

As examples of the metal salt of tungstic acid, there may be cited lithium tungstate, potassium tungstate, calcium tungstate, sodium tungstate, and magnesium tungstate. As examples of the metal salt of molybdic acid, there may be cited lithium molybdate, potassium molybdate, calcium molybdate, sodium molybdate, and lead molybdate. Among the metal salts cited above, lithium molybdate proves particularly suitable.

As transition metals belonging to Group IVa of the IUPAC Periodic Table of Elements and compounds thereof, there may be cited titanium, zirconium, and hafnium and their oxides, borides, carbides, and organic metal compounds thereof. Particularly, titanium dioxide proves desirable.

The composition containing a metal salt of tungstic acid or molybdic acid and a transition metal of Group IVa or a compound thereof may incorporate some other substances therein. Essentially the electroconductive coating to be consequently formed is required to contain the metal salt of tungstic acid or molybdic acid and the transition metal of Group IVa or the compound thereof in a total amount of not less than 50 mol% and each component in an amount of not less than 2 mol%.

The heating of composition to a temperature exceeding the melting point of the metal salt is intended to enhance the strength of adherence of the electroconductive coating to the substrate and improving the wetting property of the composition.

In forming conductive circuits of the aforementioned electroconductive coating on the ceramic substrate, there is generally adopted a method which comprises applying the metallizing composition on the circuits by printing. Otherwise, the following method may be adopted.

First, the metallizing composition is applied on the entire surface of a ceramic substrate 1 as illustrated in FIG. 1 and then subjected to the steps of melting and firing to give rise to an electroconductive coating 2. Then, a resist 3 is superposed by printing on the parts destined to constitute circuits The composite is then subjected to electropolishing as illustrated in FIG. 2. It is subsequently subjected to chemical etching to etch out all the parts other than the resist as illustrated in FIG. 3. Now, the resist is removed from the composite to give rise to an electroconductive circuit 4 made preponderantly of the mixture of tungsten and/or molybdenum with the nitride of a transition metal of Group IVa as illustrated in FIG. 4. By this method, a fine pattern using lines separated by intervals of not more than 0.5 mm can be attained.

It suffices that the electroconductive coating possessed a thickness of not less than 1 $\mu$m. The practical thickness of this coating is up to about 10 $\mu$m.

A desire to mount a semiconductor chip on the electroconductive coating or to bond a wire thereto can be satisfied by plating the electroconductive coating with a coating of nickel deposited by the electroplating or electroless plating technique and bonding the chip or the wire to the newly formed coating through the medium of solder or silver-copper solder.

DETAILED DESCRIPTION OF PREFERRED EMBODIMENT

Now, the present invention will be described more specifically below with reference to working examples.

EXAMPLE 1

A thin sheet was molded using a powder mixture consisting mainly of aluminum nitride and containing 3% by weight of yttrium oxide ($Y_2O_3$). This thin sheet was fired in an atmosphere of nitrogen gas at 1,800° C. for 60 minutes by the conventional method, to produce a sintered highly thermoconductive AlN ceramic sheet measuring 50×50×0.5 mm and possessing a thermal conductivity of 150 W/mK.

Then, on this sintered ceramic sheet, a paste prepared by combining a powdered mixture consisting of lithium molybdate ($Li_2MoO_4$) and titanium dioxide ($TiO_2$) (gravimetric ratio 1 : 1) with suitable amounts of a binder and a solvent was applied by the screen printing method to a thickness of about 10 $\mu$m and allowed to dry.

Then, the resulting composite was heated in air at about 750° C. for 5 minutes to melt $Li_2MoO_4$. It was subsequently fired in a 1 : 1 mixture of nitrogen and hydrogen at about 1,300° C. for 60 minutes, to form an electroconductive coating (metallized layer) on the sintered AlN sheet. This electroconductive coating had a thickness of about 5 $\mu$m and consisted of Mo, TiN, and a spinel phase resembling $\gamma$-$Al_2O_3$ and was found to bond strongly to the sintered AlN sheet.

The electroconductive coating thus obtained was then plated with a Ni layer about 3 $\mu$m in thickness. (The thickness of this Ni plate is practical in the range of 1 to 5 $\mu$m.)

As one example of a semiconductor device, a high frequency power amplifier module was fabricated using this substrate.

Figure 1:
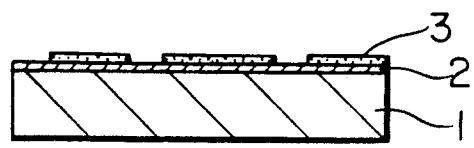
FIG. 1 through FIG. 4 are cross sections showing the series of steps followed in the formation of electroconductive circuits on a highly thermoconductive ceramic substrate of this invention.
Figure 2:
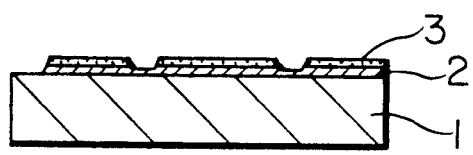
Figure 3:
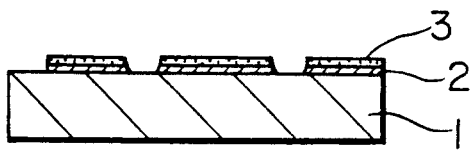
Figure 4:
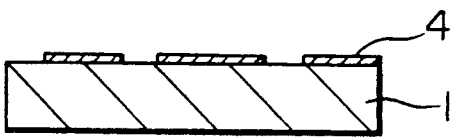
Figure 5:
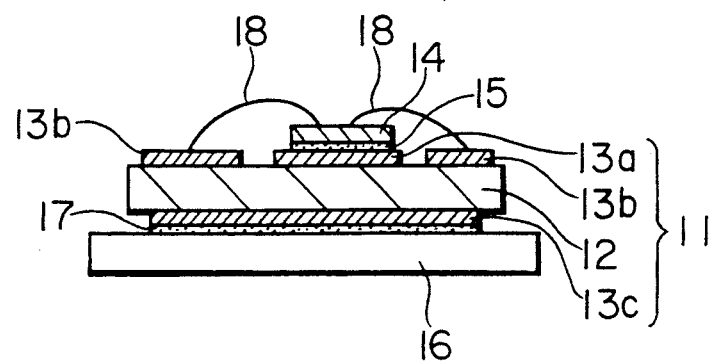
FIG. 5 and FIG. 6 are diagrams showing semiconductor devices using the highly thermoconductive ceramic substrate of the present invention.

As illustrated in FIG. 5, a high frequency power transistor chip 14 was bonded to a mount part 13a of the aforementioned AlN ceramic substrate 11 with a Au-Si solder 15 and a base metal 16 was bonded to the fixing part 13c of the substrate with a Sn-Pb solder 17. Subsequently, the transistor 14 and the circuit part 13b are connected to each other through the medium of an Al wire 18. Further on the circuit part 13b, a resistor, a coil, and a relay were mounted in position by soldering, to complete the module.

The semiconductor device produced as described above showed thermal resistance of 7.2° C./w (as measured by the $\Delta V_{BE}$ method), a value equal to the thermal resistance (7.1° C./W) of the conventional BeO substrate. It also exhibited satisfactory electrical properties such as output substantially equal to those of the conventional substrate. The strength of adhesion of the electroconductive coating was not less than 10 kg/mm$^2$ and the wire bonding strength was not less than 20 g.

EXAMPLE 2

Figure 6:
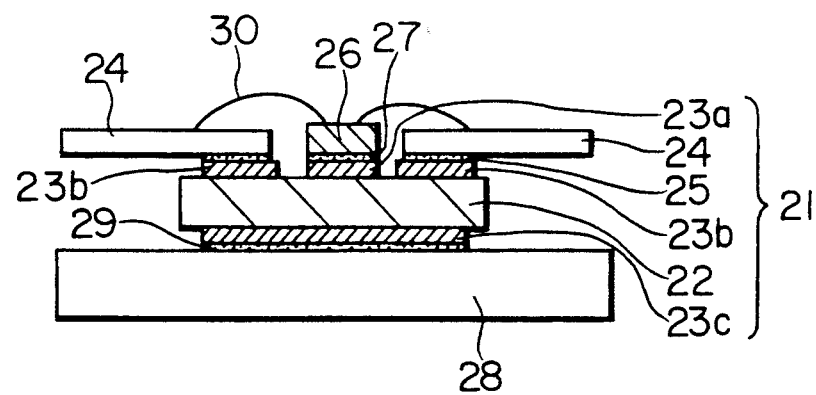

On an AlN ceramic substrate provided with an electroconductive coating and plated with a layer of Ni by following the procedure of Example 1, a lead (Fe-Ni alloy) 24 was fastened as illustrated in FIG. 6 by soldering with a silver-copper solder (Ag : Cu =72 : 28) in a reducing atmosphere at about 800° C. for 5 minutes. The joined lead showed a strength exceeding 10 kg/mm$^2$, and resulted no breakage or degradation of strength after heat cycle test (−55° C. to 150° C. ; 1,000 cycles).

Subsequently, on the AlN ceramic substrate (package), a high frequency power transistor (overlaid transistor) was mounted. A transistor 26 was bonded to the mount part 23a of the package with a Au-Si solder 27 and a base metal 28 was bonded to the fixing part 23c with a Sn-Pb solder 29.

Subsequently, the transistor 26 and the lead 24 were connected to each other through the medium of an Al wire 30, to complete the mounting.

The semiconductor device manufactured as described above showed thermal resistance of 12.0° C./w, a value equal to the thermal resistance (11.5° C./w) of the conventional BeO substrate. It showed satisfacory electrical properties such as output.

EXAMPLE 3

A metallizing paste was prepared by combining a 1 : 1 powdered mixture of lithium molybdate and titanium dioxide with suitable amounts of a binder and a solvent. On the entire surface of a ceramic substrate (30 mm×45 mm×0.5 mm) of aluminum nitride containing yttrium oxide as a sintering aid, the paste was applied by the screen printing technique. The resulting composite was dried, then heated in the air at 750° C. for 5 minutes to melt lithium molybdate, and subsequently fired in a 1 : 1 mixture of nitrogen and hydrogen at 1,300° C. for 60 minutes, to give rise to an electroconductive coating.

This electroconductive coating consisted of TiN, Mo, and a spinel phase resembling $\gamma$-$Al_2O_3$.

On the electroconductive coating thus formed, a resist was applied in a pattern to form circuits of a prescribed design by the printing method and then subjected to electropolishing in dilute sulfuric acid under the conditions of 20 V and 2 A. The electropolishing was discontinued when the golden color of titanium nitride began to show. The composite was then chemically etched in a 1:1 solution of potassium hydroxide and sodium hydroxide at a temperature of 50° C. Then, the resist was removed, to complete electroconductive circuits. The circuits enjoyed a far more desirable fine pattern than those obtained by any of the conventional method. A semiconductor substrate was produced by electroplating necessary parts of the substrate with nickel and mounting a semiconductor chip on and bonding a wire to the nickel plate with solder and silver-copper solder. The semiconductor substrate thus produced showed a heat radiating efficiency 5 to 6 times that of the conventional semiconductor substrate using a ceramic substrate of alumina. The bonding strength of the wire was favorably comparable with conventional device.

As described above, the highly thermoconductive ceramic substrate of the present invention possesses an electroconductive coating which enjoys high strength of adhesion and permits formation of very fine conductive circuits. Thus, it is highly useful for IC and LSI substrates.

What is claimed is:

1. A highly thermoconductive ceramic substrate for use in the manufacture of a semiconductor, said highly thermoconductive ceramic substrate comprising a ceramic substrate consisting essentially of aluminum nitride as a main component and an electroconductive coating formed directly on said ceramic substrate, said electroconductive coating consisting essentially of a sintered ceramic including at least one nitride-forming element selected from the Group IVa of the IUPAC Periodic Table and at least one element selected from the group consisting of tungsten and molybdenum, and said electroconductive coating having a substantially uniform thickness.

2. A highly thermoconductive ceramic substrate for use in the manufacture of a semiconductor, said highly thermoconductive ceramic substrate comprising a ceramic substrate consisting essentially of aluminum nitride as the main component and an electroconductive coating formed directly on said ceramic substrate, said electroconductive coating consisting essentially of a sintered ceramic including at least one nitride-forming element selected from the Group IVa of the IUPAC Periodic Table and at least one element selected from the group consisting of tungsten and molybdenum, said electroconductive coating having a substantially uniform thickness, said highly thermoconductive ceramic substrate being produced by a method comprising applying a metallizing composition onto a surface of said ceramic substrate, said metallizing composition comprising at least one metal salt selected from the group consisting of tungstic acid and molybdic acid, at least one metal compound selected from the group consisting of oxide, boride, carbide and organic compound of a metal selected from Group IVa of the IUPAC Periodic Table and a binder, drying said metallizing composition, heating said metallizing composition to fuse said at least one metal salt and firing said metallizing composition in a nonoxidizing atmosphere to react said sintered ceramic with said at least one metal compound to result in said electroconductive coating.

3. A highly thermoconductive ceramic substrate according to claim 2, wherein said electroconductive coating is a patterned circuit formed by electropolishing and/or chemical etching.

4. A highly thermoconductive ceramic substrate according to claim 9 or claim 3, which further comprises a metal coating deposited on said electroconductive coating.

5. A highly thermoconductive ceramic substrate according to claim 2, wherein said electroconductive coating comprises molybdenum and titanium nitride.

* * * * *

UNITED STATES PATENT AND TRADEMARK OFFICE
CERTIFICATE OF CORRECTION

PATENT NO. : 5,164,246
DATED : November 17, 1992
INVENTOR(S) : Shunichiro Tanaka et al.

It is certified that error appears in the above-identified patent and that said Letters Patent is hereby corrected as shown below:

On the title page, item (54), in the title, after "Ceramic" insert --Substrate--.

Claim 4, column 6, line 36, change "claim 9, to --claim 2--.

Signed and Sealed this

First Day of February, 1994

Attest:

BRUCE LEHMAN

Attesting Officer     Commissioner of Patents and Trademarks